US011655534B2

(12) United States Patent
Hou et al.

(10) Patent No.: US 11,655,534 B2
(45) Date of Patent: May 23, 2023

(54) APPARATUS FOR REDUCING TUNGSTEN RESISTIVITY

(71) Applicant: APPLIED MATERIALS, INC., Santa Clara, CA (US)

(72) Inventors: Wenting Hou, San Jose, CA (US); Jianxin Lei, Fremont, CA (US); Jothilingam Ramalingam, Milpitas, CA (US); Prashanth Kothnur, San Jose, CA (US); William R. Johanson, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/857,370

(22) Filed: Jul. 5, 2022

(65) Prior Publication Data
US 2022/0341025 A1 Oct. 27, 2022

Related U.S. Application Data

(62) Division of application No. 17/021,661, filed on Sep. 15, 2020, now Pat. No. 11,447,857.

(51) Int. Cl.
| | |
|---|---|
| *H01J 37/32* | (2006.01) |
| *C23C 14/18* | (2006.01) |
| *C23C 14/34* | (2006.01) |
| *C23C 14/35* | (2006.01) |
| *C23C 14/14* | (2006.01) |
| *C23C 14/16* | (2006.01) |

(52) U.S. Cl.
CPC ............ *C23C 14/18* (2013.01); *C23C 14/14* (2013.01); *C23C 14/16* (2013.01); *C23C 14/3414* (2013.01); *C23C 14/354* (2013.01); *H01J 37/32027* (2013.01); *H01J 37/32082* (2013.01)

(58) Field of Classification Search
None
See application file for complete search history.

(56) References Cited

U.S. PATENT DOCUMENTS

| | | | |
|---|---|---|---|
| 5,888,414 A * | 3/1999 | Collins | H01J 37/32165 257/E21.252 |
| 6,200,433 B1 | 3/2001 | Ding et al. | |
| 8,895,450 B2 | 11/2014 | Cao et al. | |

(Continued)

OTHER PUBLICATIONS

CANON ANELVA PVD and Etching Equipments, Canon, 2017, 3 pages, China.

(Continued)

*Primary Examiner* — Jason Berman
(74) *Attorney, Agent, or Firm* — Moser Taboada

(57) ABSTRACT

Apparatus that forms low resistivity tungsten film on substrates. In some embodiments, the apparatus may provide reduced resistivity of tungsten by being configured to generate a plasma in a processing volume of a physical vapor deposition (PVD) chamber with a process gas of krypton and using an RF power with a frequency of approximately 60 MHz, apply bias power at frequency of approximately 13.56 MHz to a substrate, and sputter a tungsten target to deposit a tungsten thin film on the substrate. At least approximately 90% of the deposited tungsten thin film has a <110> crystalline orientation plane approximately parallel to a top surface of the substrate.

10 Claims, 2 Drawing Sheets

(56) References Cited

U.S. PATENT DOCUMENTS

| | | |
|---|---|---|
| 9,117,821 B2 | 8/2015 | Barmak Vaziri et al. |
| 9,281,240 B2 | 3/2016 | Moon et al. |
| 9,984,976 B2 | 5/2018 | Cheng et al. |
| 2006/0063025 A1 | 3/2006 | Huang et al. |
| 2011/0094879 A1 | 4/2011 | Suzuki et al. |
| 2011/0303960 A1* | 12/2011 | Cao .................. H01L 21/28079 257/E21.294 |
| 2017/0145553 A1 | 5/2017 | Liu et al. |
| 2018/0337052 A1 | 11/2018 | Ramalingam et al. |
| 2019/0066988 A1 | 2/2019 | He et al. |
| 2020/0048760 A1 | 2/2020 | Kalathiparabil et al. |

OTHER PUBLICATIONS

Zheng et al., The anisotropic size effect of the electrical resistivity of metal thin films: Tungsten, Journal of Applied Physics 122, Oct. 3, 2017, 12 pages, New York.
International Search Report and Written Opinion for PCT/US2021/050030 dated Jan. 3, 2022.

* cited by examiner

APPARATUS FOR REDUCING TUNGSTEN RESISTIVITY

CROSS-REFERENCE TO RELATED APPLICATIONS

This application is a divisional of co-pending U.S. patent application Ser. No. 17/021,661, filed Sep. 15, 2020, which is herein incorporated by reference.

FIELD

Embodiments of the present principles generally relate to semiconductor processing of semiconductor substrates.

BACKGROUND

Materials selected for semiconductor structures are often chosen based on the sizing or dimensions required for the structures. As the need for smaller critical dimensions shrinks the sizes of the structures, limitations of selected materials may cause roadblocks that prevent further miniaturization. A material that has low resistivity at a thickness of 500 angstroms may become highly resistive at 250 angstroms, limiting the use of the material in smaller sized structures. The inventors have observed that tungsten dramatically increases in resistivity as the thickness of the tungsten is reduced. Requirements for thinner layers of tungsten may drive manufacturers to abandon tungsten and look for expensive alternatives, increasing the costs of semiconductor structures.

Accordingly, the inventors have provided improved methods and apparatus for reducing the resistivity of tungsten.

SUMMARY

Methods and apparatus for reducing the resistivity of tungsten are provided herein.

In some embodiments, a method of reducing resistivity of tungsten comprises generating a plasma in a processing volume of a physical vapor deposition (PVD) chamber with a process gas of krypton and using RF power with a frequency of approximately 60 MHz and a magnetron, applying bias power at a frequency of approximately 13.56 MHz to a substrate, and sputtering a tungsten target to deposit a tungsten thin film on the substrate, wherein at least approximately 90% of the tungsten thin film has a <110> crystal orientation plane approximately parallel to a top surface of the substrate.

In some embodiments, the method may further include depositing the tungsten thin film on the substrate at a first temperature when the substrate is composed of silicon or depositing the tungsten thin film on the substrate at a second temperature when the substrate is composed of silicon nitride, wherein the first temperature is different from the second temperature, using a magnetic field to influence plasma density and distribution in the PVD chamber and uniformity of deposition on the substrate, wherein the tungsten thin film has a resistivity value of approximately 9.5 μohm-cm or less at an approximately 200 angstrom thickness, and/or wherein the RF power is approximately 4 kilowatts or more and wherein the bias power is greater than zero to less than approximately 500 kilowatts.

In some embodiments, a non-transitory, computer readable medium having instructions stored thereon that, when executed, cause a method for reducing resistivity of tungsten to be performed, the method comprises generating a plasma in a processing volume of a physical vapor deposition (PVD) chamber with a process gas of krypton and using RF power at a frequency of approximately 40 MHz to approximately 75 MHz and a magnetron, applying bias power to a substrate, applying a current to an electromagnet surrounding the processing volume at a level proximate to the substrate, and sputtering a tungsten target to deposit a tungsten thin film on the substrate.

In some embodiments, the method of the non-transitory, computer readable medium may further include wherein the bias power has a frequency of 13.56 MHz, wherein the RF power is greater than zero to approximately 10 kilowatts, wherein the RF power is approximately 4 kilowatts, wherein the bias power is greater than zero to approximately 500 watts, depositing the tungsten thin film on the substrate at a first temperature when the substrate is composed of silicon or depositing the tungsten thin film on the substrate at a second temperature when the substrate is composed of silicon nitride, wherein the first temperature is different from the second temperature, wherein the RF power has a frequency of approximately 60 MHz, wherein at least approximately 90% of the tungsten thin film has a <110> crystal orientation plane approximately parallel to a top surface of the substrate, using a magnetic field to influence plasma density and distribution in the PVD chamber and uniformity of deposition on the substrate, and/or wherein the tungsten thin film has a resistivity value of approximately 9.5 μohm-cm or less at a 200 angstrom thickness.

In some embodiments, an apparatus for depositing tungsten film with low resistivity may comprise a physical vapor deposition (PVD) chamber with a processing volume disposed between a target and a substrate support, wherein the PVD chamber has a target-to-substrate spacing of approximately 75 mm to approximately 150 mm and wherein the target is made of tungsten and configured for sputtering by plasma generated in the processing volume, a magnetron configured to generate magnetic fields during sputtering of the target, a process gas supply source configured to provide krypton gas into the processing volume, an RF power source configured to generate a plasma from the krypton gas within the processing volume at a frequency of approximately 40 MHz to approximately 75 MHz, a bias power source configured to supply a bias to a substrate placed on the substrate support, and a magnetic field source surrounding the processing volume at a level proximate to a top surface of the substrate support, wherein the magnetic field source is configured to influence plasma density and distribution in the PVD chamber and uniformity of deposition on the substrate.

In some embodiments, the apparatus may further include wherein the RF power source is configured to generate a plasma within the processing volume at a frequency of approximately 60 MHz with a power of approximately 4 kilowatts, wherein the bias power source is configured to operate at a frequency of 13.56 MHz with a power of greater than zero to less than approximately 500 watts, wherein the magnetic field source is an electromagnet with a dual coil and an adjustable magnetic field, and/or wherein the magnetic field source is a plurality of permanent magnets placed and spaced externally to the PVD chamber.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
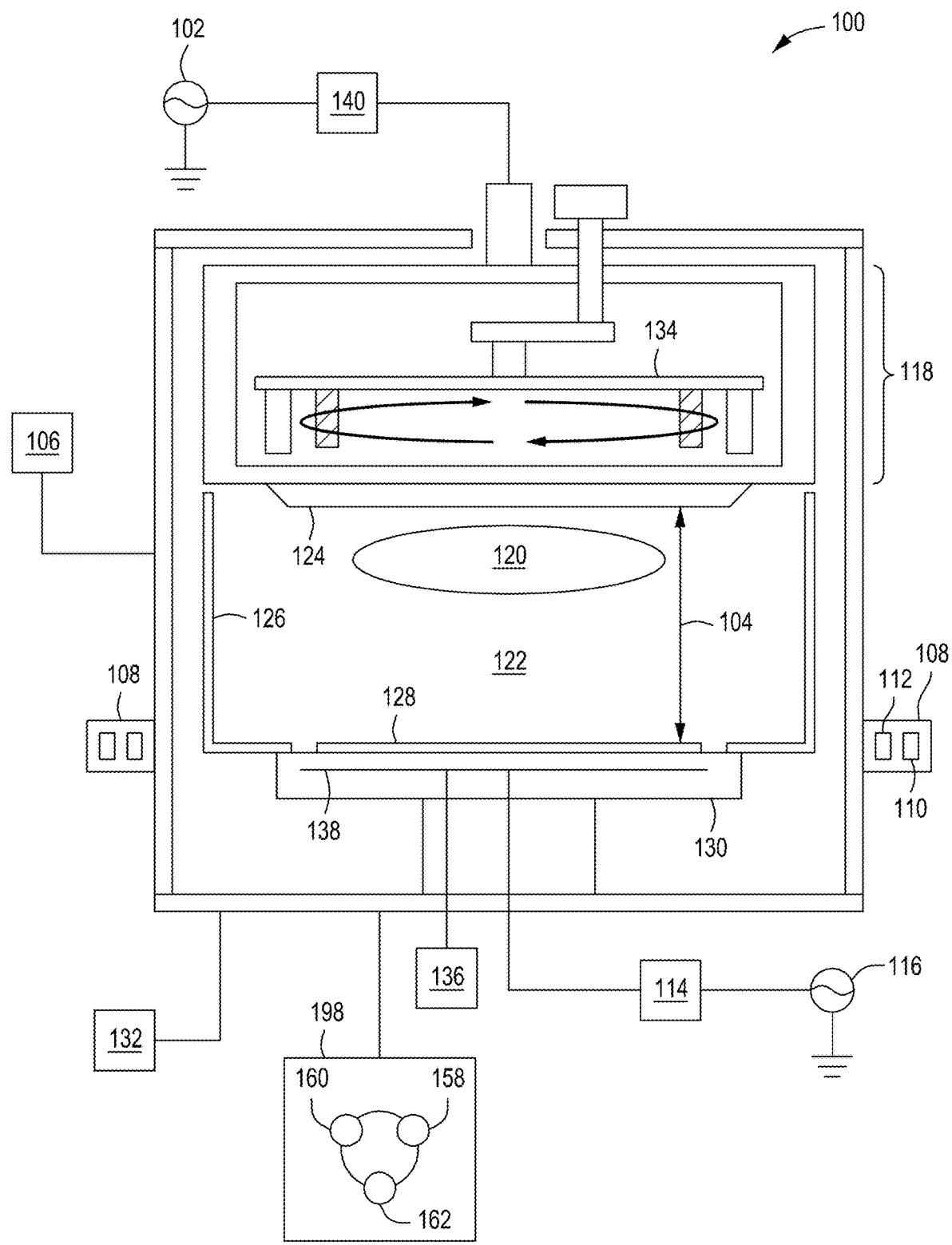
FIG. 1 depicts a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a reduced resistivity of tungsten (W) thin films. Tungsten thin films are deposited such that a smaller mean free path (tungsten crystal orientation <110>) is created in a majority of the crystal structure of the tungsten. In some embodiments, the tungsten thin film deposited may have a 95% or greater <110> crystal orientation in a plane parallel to a top surface of a substrate. The methods and apparatus leverage, for example, a physical vapor deposition (PVD) chamber with a very high frequency (VHF) plasma generating power source along with a magnetron to sputter a tungsten target to deposit a tungsten thin film on a biased substrate. The example combination promotes the growth of the <110> crystal orientation, leading to a low resistivity tungsten for thin film applications.

PVD tungsten deposited by a DC power source has been used in dynamic random-access memory (DRAM) bit lines for many years, providing a lower resistivity metal film for the DRAM bit line. However, as devices shrink through technology nodes, the critical dimension (CD) for tungsten is getting smaller, leading to higher resistivity for thin film tungsten (approximately 15 nm or less). Previous methods for thin film tungsten resistivity reduction have reached functional limits. The methods and apparatus of the present principles enable resistivity reduction for thin film tungsten to advantageously extend the use of tungsten into the future technology node. For example, on 100 to 300 angstrom tungsten film, an approximately 5% to 15% or more tungsten film resistivity reduction on an oxide substrate is achievable in comparison to a DC plasma sputter process. The <110> crystal orientation increases from around 60% for the DC plasma sputter processes, to more than 90% in VHF RF plasma sputter processes using the present principles. The enhancement of tungsten <110> growth was observed on different substrates such as, for example, silicon nitride (SiN) as well. The benefits of the present principles are even more dramatic on DRAM bit line substrates, for example, where more than a 20% resistivity reduction on WSiN substrates was achieved with VHF RF PVD W, compared to DC plasma sputter processes.

Grain size, phase structure, impurity, surface roughness, and density of deposited material factor into the resistivity of the deposited film. The inventors have found that film morphology is critical for low resistivity more so than surface roughness and density. Different film morphologies indicate a different crystal orientation. A low resistivity film will have more <110> crystal orientation in a plane parallel to the surface plane of the substrate. A high level of <110> crystal orientation in a deposition layer will have a columnar-like morphology with a feather-like topography as seen in an AFM (atomic force microscopy) scan or top TEM (transmission electron microscope) scan. The frequency of the RF power, operation of a magnetron, bias power, temperature, and low pressure all have an affect on the formation of the <110> crystal orientation.

FIG. 1 is an apparatus in which methods for reducing resistivity of tungsten may be practiced. The apparatus includes a PVD chamber 100 with a source assembly 118, a target 124, and a substrate support 130. A magnetron assembly 134 is used to confine the electrons near the target during processing. The magnetron assembly 134 may be open, closed, partially closed, etc. The PVD chamber 100 has a processing volume 122 disposed between the target 124 and the substrate support 130. The processing volume 122 may be surrounded by a shield 126. In some embodiments, a target-to-substrate distance 104 is approximately 75 mm to approximately 150 mm. In some embodiments, a target-to-substrate distance 104 is approximately 90 mm to approximately 150 mm. In some embodiments, a target-to-substrate distance 104 is approximately 95 mm. An RF power source 102 provides RF power through an RF match network 140 to create plasma 120 in the processing volume 122. In some embodiments, the RF power source 102 provides RF power at a frequency of approximately 40 MHz to approximately 75 MHz. In some embodiments, the RF power source 102 provides RF power at a frequency of approximately 50 MHz to approximately 70 MHz. In some embodiments, the RF power source 102 provides RF power at a frequency of approximately 60 MHz. In some embodiments, the RF power source 102 provides RF power at a frequency of approximately 65 MHz or greater. The increase in frequency of the RF power changes the ion energy distribution. The higher the frequency the more formation of <110> tungsten crystal orientation achieved in deposited tungsten thin films. The upper frequency limit is due mainly to chamber design limitations. In some embodiments, the RF power source operates at a power of greater than zero to approximately 10 kilowatts or more. In some embodiments, the RF power source operates at a power of greater than approximately 3 kilowatts to approximately 10 kilowatts. In some embodiments, the RF power source operates at a power of approximately 4 kilowatts. In some embodiments, the RF power source operates at a power of approximately 6 kilowatts to approximately 10 kilowatts. The higher the power the more <110> crystal orientation is generated in the deposited tungsten thin film. The upper power limit is mainly due to limitations of the PVD chamber due to stress. The very high frequency RF also provides an increase ion density on the substrate 128.

A bias power source 116 provides bias power to the substrate 128 through a bias match network 114. In some embodiments, the bias power source 116 provides bias power at a frequency of approximately 13.56 MHz. In some embodiments, the bias power source operates at a power of greater than zero to approximately 500 watts. In some embodiments, the bias power source operates at a power of approximately 200 watts to approximately 400 watts. The bias power is used to control the substrate potential and increase ion energy at the substrate surface. In some embodiments, the combination of the RF power, bias power, and magnetron, enable promotion of a tungsten crystal growth in the <110> plane during PVD deposition. The tungsten <110> orientation has a smaller mean free path and lower resistivity, especially for thin film depositions. The PVD chamber 100 may also include a process gas source 106 that provides a process gas to the processing volume 122 during plasma generation. In some embodiments, the processing gas may include krypton. Krypton may be used to reduce the amount of process gas material that is incorporated into the deposition material during processing, increasing the purity of the deposition material. A vacuum source 132 may also be included in the PVD chamber 100 to allow adjustment of the pressure inside the processing volume 122. More growth of the <110> crystal orientation is achieved at lower pressure. In some embodiments, the pressure may be from approximately 1 mTorr to approximately 15 mTorr.

The PVD chamber 100 may also include a heating system 136 that includes at least one heating element 138 to allow control of the substrate 128 temperature during processing. In some embodiments, the heating system 136 may sustain the substrate at a temperature of approximately 150 degrees Celsius to approximately 450 degrees Celsius. In some embodiments, heating system 136 may sustain the substrate at a temperature of approximately 200 degrees Celsius to approximately 400 degrees Celsius. Higher substrate temperatures promote larger grain size formation in the deposition material. The inventors have discovered that the substrate temperature impacts the formation of <110> crystal orientation differently for different types of substrate materials (see discussion below).

Figure 2:
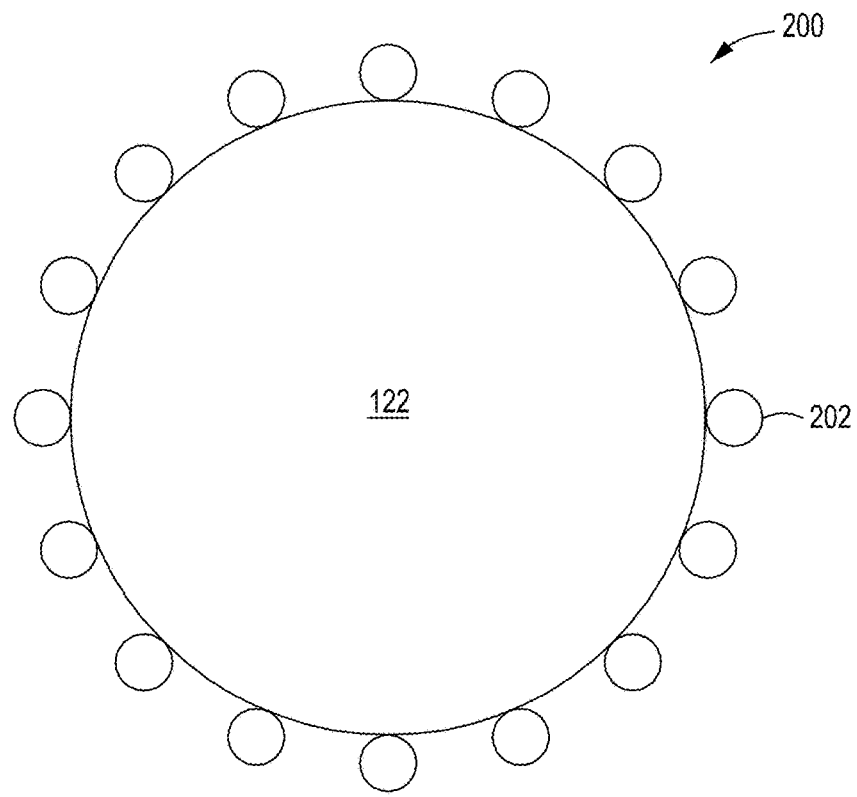
FIG. 2 depicts a top-down view of a processing volume surrounded by magnets in accordance with some embodiments of the present principles.

The inventors have found that when operating a PVD chamber with bias power, the bias power causes a high resputtering of the edge of the substrates compared to the center due to the magnetron design and the target-to-magnetron spacing. The inventors have discovered that a magnetic field source can be used to reduce the high resputtering ratio at the substrate edge, increasing film uniformity. The magnetic field source affects the plasma generation and distribution in the chamber, which affects the deposition profile on the substrate. In some embodiments, the PVD chamber 100 may include a magnetic field source 108 that surrounds the processing volume 122 at a level proximate to the substrate 128. In some embodiments, the magnetic field source 108 may be an electromagnet (shown in FIG. 1) with, for example, a dual coil 110, 112. The magnetic field of the electromagnet can be adjusted during processing by adjusting a level of a current passing through the coils and/or the direction of the current passing through the coils. In some embodiments, the current may be from greater than zero to approximately 25 amps. In some embodiments, the current may be approximately 6 amps. In some embodiments as shown in a top down view 200 of FIG. 2, the magnetic field source 108 may include a plurality of permanent magnets 202 spaced around the processing volume 122. The inventors have found that the plurality of permanent magnets 202 impacts the magnetic distribution in the processing volume 122, and, ultimately, the uniformity of the deposited material on the substrate. In some embodiments, the permanent magnets 202 may be used to adjust the edge deposition on the substrate. The edge deposition effect (e.g., increasing or decreasing of deposition on the edges) of the orientation of the permanent magnets 202 (e.g., orientation of north pole up or south pole up) is dependent on the chamber and/or magnetron designs.

A controller 198 controls the operation of the PVD chamber 100 including, for example, magnetron operation, substrate temperature, and electromagnetic fields. In operation, the controller 198 enables data collection and feedback from the respective systems to optimize performance of the PVD chamber 100. The controller 198 generally includes a Central Processing Unit (CPU) 160, a memory 158, and a support circuit 162. The CPU 160 may be any form of a general-purpose computer processor that can be used in an industrial setting. The support circuit 162 is conventionally coupled to the CPU 160 and may comprise a cache, clock circuits, input/output subsystems, power supplies, and the like. Software routines, such as a method as described above may be stored in the memory 158 and, when executed by the CPU 160, transform the CPU 160 into a specific purpose computer (controller 198). The software routines may also be stored and/or executed by a second controller (not shown) that is located remotely from the PVD chamber 100.

The memory 158 is in the form of computer-readable storage media that contains instructions, when executed by the CPU 160, to facilitate the operation of the semiconductor processes and equipment. The instructions in the memory 158 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 3:
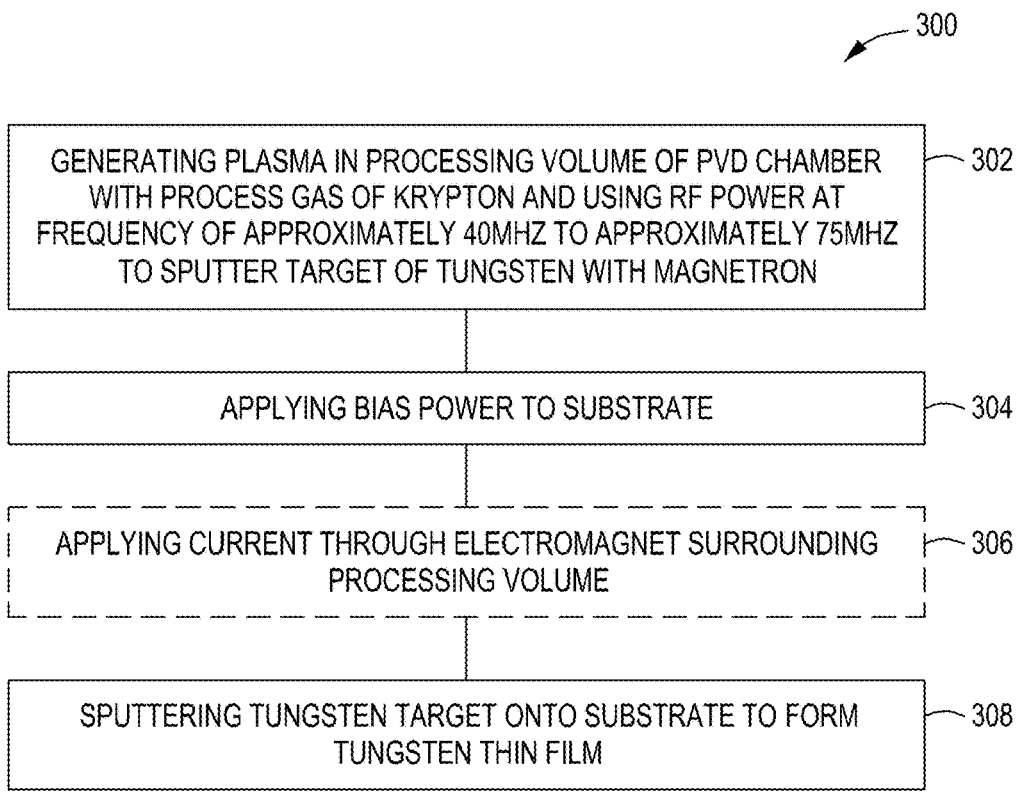
FIG. 3 is a method of reducing resistivity in tungsten depositions in accordance with some embodiments of the present principles.

FIG. 3 is a method 300 of reducing resistivity in tungsten depositions in accordance with some embodiments. In block 302, plasma is generated in a processing volume of a PVD chamber using krypton as the process gas and an RF power at a frequency of approximately 40 MHz to approximately 75 MHz to sputter a tungsten target with a magnetron. The magnetron facilitates in confining the electrons produced by the plasma near the target to increase ion density on the substrate. Krypton may be used to reduce the amount of process gas material that is incorporated into the deposition material during processing, increasing the purity of the deposition material and decreasing the resistivity of the deposition material. In some embodiments, the RF power has a frequency of approximately 40 MHz to approximately 70 MHz. In some embodiments, the RF power has a frequency of approximately 50 MHz to approximately 70 MHz. In some embodiments, the RF power has a frequency of approximately 60 MHz. In some embodiments, the RF power has a frequency of approximately 65 MHz or greater. The increase in frequency of the RF power changes the ion energy distribution. The higher the frequency the more formation of <110> tungsten crystal orientation achieved in deposited tungsten thin films. The upper frequency limit is due mainly to chamber design limitations. In some embodiments, the RF power is greater than zero to approximately 10 kilowatts. In some embodiments, the RF power is approximately 4 kilowatts. In some embodiments, the RF power is approximately 6 kilowatts to approximately 10 kilowatts. The higher the power the more <110> crystal orientation is generated in the deposited tungsten thin film.

The upper power limit is mainly due to limitations of the PVD chamber due to stress. The very high frequency RF also provides an increase ion density on the substrate surface.

In block 304, a bias power is applied to the substrate. In some embodiments, the bias power has a frequency of approximately 13.56 MHz. In some embodiments, the bias power is greater than zero to approximately 500 watts. In some embodiments, the bias power source operates at a power of approximately 200 watts to approximately 400 watts. The bias power is used to control the substrate potential and to increase ion energy at the substrate surface. In some embodiments, in optional block 306, a current is applied through an electromagnet surrounding the processing volume to influence plasma density and distribution in the PVD chamber and to influence the uniformity of deposition on the substrate. The electromagnet surrounds the processing volume at a level proximate to a top surface of a substrate support or a substrate when present. In some embodiments, permanent magnets may be used in place of the electromagnet.

In block 308, tungsten is sputtered onto the substrate to form a tungsten thin film. In some embodiments, the combination of the RF power, bias power, and magnetron, enable promotion of a tungsten crystal growth in the <110> plane during PVD deposition. The tungsten <110> orientation has a smaller mean free path and lower resistivity, especially for thin film depositions. In some embodiments, at least approximately 90% of the tungsten thin film has a <110> crystal orientation plane approximately parallel to a top surface of the substrate, substantially decreasing the resistivity of the tungsten thin film. The inventors have also discovered that the temperature influences the tungsten <110> crystal orientation when the deposition occurs on substrates of different materials. For example, a WSi substrate, a WSiN substrate, and a SiN substrate may have different substrate temperatures for optimum formation of <110> crystal orientation. The methods of the present principles allow a tungsten thin film to be deposited with a resistivity value of approximately 9.5 µohm-cm or less at a 200 angstrom thickness. In some embodiments, a tungsten thin film may be deposited with a resistivity value of approximately 9.0 µohm-cm or less at a 200 angstrom thickness.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for depositing tungsten film with low resistivity, comprising:
   a physical vapor deposition (PVD) chamber with a processing volume disposed between a target and a substrate support, wherein the PVD chamber has a target-to-substrate spacing of approximately 75 mm to approximately 150 mm and wherein the target is made of tungsten and configured for sputtering by plasma generated in the processing volume;
   a magnetron configured to generate magnetic fields during sputtering of the target;
   a process gas supply source configured to provide krypton gas into the processing volume;
   an RF power source configured to generate a plasma from the krypton gas within the processing volume at a frequency of approximately 40 MHz to approximately 75 MHz;
   a bias power source configured to supply a bias to a substrate placed on the substrate support;
   a magnetic field source surrounding the processing volume at a level proximate to a top surface of the substrate support, wherein the magnetic field source is configured to influence plasma density and distribution in the PVD chamber and uniformity of deposition on the substrate; and
   a controller in communication with the apparatus and configured to generate a plasma in a pressure of approximately 1 mTorr to approximately 15 mTorr in a processing volume of the PVD chamber with a process gas of krypton and using RF power of approximately 6 kilowatts to 10 kilowatts with a frequency of approximately 60 MHz, to apply a bias power at a frequency of approximately 13.56 MHz to a substrate, and to sputter the target to deposit a tungsten thin film on the substrate, wherein at least approximately 90% of the tungsten thin film has a 110 crystal orientation plane approximately parallel to a top surface of the substrate, wherein the tungsten thin film has a resistivity value of approximately 9.5 µohm-cm or less at an approximately 200 angstrom thickness.

2. The apparatus of claim 1, wherein the controller is configured to apply a bias power of greater than zero to less than approximately 500 watts during deposition of the tungsten thin film.

3. The apparatus of claim 1, wherein the magnetic field source is an electromagnet with a dual coil and an adjustable magnetic field and configured to operate at greater than zero to approximately 25 amps.

4. The apparatus of claim 3, wherein the controller is configured to operate the magnetic field source at approximately 6 amps during deposition of the tungsten thin film.

5. The apparatus of claim 1, wherein the magnetic field source is a plurality of permanent magnets placed and spaced externally to the PVD chamber.

6. The apparatus of claim 1, further comprising:
   a heating system in electrical communication with a heating element in the substrate support and configured to heat a substrate, wherein the controller is in communication with the heating system and is configured to maintain the substrate at a temperature of 150 degrees to approximately 450 degrees during deposition of the tungsten thin film.

7. The apparatus of claim 6, wherein the controller is configured to deposit the tungsten thin film on the substrate at a first temperature when the substrate is composed of silicon or at a second temperature when the substrate is composed of silicon nitride, wherein the first temperature is different from the second temperature.

8. The apparatus of claim 1, wherein the controller is configured to influence plasma density and distribution in the PVD chamber and uniformity of deposition on the substrate during deposition of the tungsten thin film.

9. The apparatus of claim 1, further comprising:
   a bias match configured to match impedances between the PVD chamber and the bias power source; and
   an RF power match configured to match impedances between the PVD chamber and the RF power source.

10. The apparatus of claim 1, wherein the controller is in communication with the process gas supply source and configured to control a flow of krypton gas during deposition of the tungsten thin film.

* * * * *